(12) United States Patent
Hayden et al.

(10) Patent No.: US 7,705,650 B2
(45) Date of Patent: Apr. 27, 2010

(54) SYSTEM AND METHOD FOR EFFECTIVELY IMPLEMENTING AN IQ GENERATOR

(75) Inventors: Frank E. Hayden, Aptos, CA (US); Bernard J. Griffiths, Ben Lomond, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 26 days.

(21) Appl. No.: 12/080,161

(22) Filed: Apr. 1, 2008

(65) Prior Publication Data
US 2009/0045861 A1 Feb. 19, 2009

Related U.S. Application Data

(60) Provisional application No. 60/964,766, filed on Aug. 14, 2007.

(51) Int. Cl.
*H03K 3/00* (2006.01)
(52) U.S. Cl. .................. 327/238; 327/202; 327/215
(58) Field of Classification Search ......... 327/199–203, 327/208–210, 214–219, 238, 115, 117

See application file for complete search history.

(56) References Cited

U.S. PATENT DOCUMENTS

| | | | |
|---|---|---|---|
| 5,787,362 A * | 7/1998 | Matero ................. 455/553.1 |
| 6,218,878 B1 * | 4/2001 | Ueno ..................... 327/202 |
| 6,683,480 B2 * | 1/2004 | Zhang et al. ............. 327/115 |
| 6,747,499 B2 | 6/2004 | Sanduleanu |
| 7,348,818 B2 * | 3/2008 | Hulfachor et al. ........ 327/156 |
| 2006/0280278 A1 * | 12/2006 | Schabel et al. ........... 377/47 |

* cited by examiner

*Primary Examiner*—An T Luu
(74) *Attorney, Agent, or Firm*—Gregory J Koerner; Redwood Patent Law

(57) ABSTRACT

A system and method for effectively implementing an IQ generator includes a master latch that generates an I signal and a slave latch that generates a Q signal. The master latch includes a master data circuit, a master latch circuit, and a master clock circuit. The slave latch includes a slave data circuit, a slave latch circuit, and a slave clock circuit. A cross-coupled current-source technique is used to compensate for certain device mismatches. A current source A generates an operating current A for the master clock circuit, the master data circuit, and the slave data circuit, and a current source B generates an operating current B for the slave clock circuit, the master latch, and the slave latch. In addition, resistors are utilized to provide fixed impedances to compensate for device mismatches between certain components in the master clock circuit and the slave clock circuit.

20 Claims, 8 Drawing Sheets

SYSTEM AND METHOD FOR EFFECTIVELY IMPLEMENTING AN IQ GENERATOR

CROSS-REFERENCE TO RELATED APPLICATION

This Application claims priority in U.S. Provisional Patent Application No. 60/964,766 entitled "Divide By 2 Generator With Device Mismatch Compensation," that was filed on Aug. 14, 2007. The foregoing related Application is commonly owned, and is hereby incorporated by reference.

BACKGROUND SECTION

1. Field of the Invention

This invention relates generally to techniques for transferring electronic information, and relates more particularly to a system and method for effectively implementing an IQ generator.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that wirelessly transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing an IQ generator. In accordance with one embodiment, the IQ generator comprises a master latch that generates an I signal, and a slave latch that generates a Q signal. In one embodiment, the master latch is implemented with complementary transistor pairs to include a master data circuit with a transistor Q5 and a transistor Q6, a master latch circuit with a transistor Q7 and a transistor Q8, and a master clock circuit with a transistor Q1 and a transistor Q2. The slave latch is similarly implemented with complementary transistor pairs to include a slave data circuit with a transistor Q9 and a transistor Q10, a slave latch circuit with a transistor Q11 and a transistor Q12, and a slave clock circuit with a transistor Q3 and a transistor Q4.

In one embodiment, a current source A provides operating current A to the sources of transistor Q1 and transistor Q2 of the master clock transistor pair. The drain of transistor Q1 of the master clock transistor pair is connected to the sources of transistor Q5 and transistor Q6 of the master data transistor pair. The drain of transistor Q2 is connected to the sources of transistor Q9 and transistor Q10 of the slave data transistor pair. In this embodiment, a current source B provides operating current B to the sources of transistor Q3 and transistor Q4 of the slave clock transistor pair. The drain of transistor Q3 of the slave clock transistor pair is connected to the sources of transistor Q7 and transistor Q8 of the master latch transistor pair. The drain of transistor Q4 is connected to the sources of transistor Q11 and transistor Q12 of the slave latch transistor pair.

In one embodiment, the master clock transistor pair has a resistor R1 connected between the drains of the clock transistors Q1 and Q2. Similarly, the slave clock transistor pair has a resistor R2 connected between the drains of the clock transistors Q3 and Q4. Resistor R1 helps to specifically define the impedance at the source-drain connection between Q1, Q5 and Q6, as well as the source-drain connection between Q2, Q9 and Q10. Similarly, resistor R2 helps to specifically define the impedance at the source-drain connection between Q3, Q7 and Q8, as well as the source-drain connection between Q4, Q11 and Q12.

The foregoing cross-coupled current-source technique is used to compensate for certain device mismatches. The current source A generates operating current A for the master clock circuit, the master data circuit, and the slave data circuit, and the current source B generates operating current B for the slave clock circuit, the master latch, and the slave latch. In addition, the fixed resistors R1 and R2 are utilized to provide fixed impedances to compensate for device mismatches between certain components in the master clock circuit and the slave clock circuit. For all of the foregoing reasons, the present invention provides an improved system and method for effectively implementing an IQ generator.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively implementing an IQ generator, and includes a master latch that generates an I signal and a slave latch that generates a Q signal. The master latch includes a master data circuit, a master latch circuit, and a master clock circuit. The slave latch includes a slave data circuit, a slave latch circuit, and a slave clock circuit. A cross-coupled current-source technique is used to compensate for certain device mismatches. A current source A generates an operating current A for the master clock circuit, the master data circuit, and the slave data circuit, and a current source B generates an operating current B for the slave clock circuit, the master latch, and the slave latch. In addition, resistors are utilized to provide fixed impedances to compensate for device mismatches between certain components in the master clock circuit and the slave clock circuit.

Figure 1:
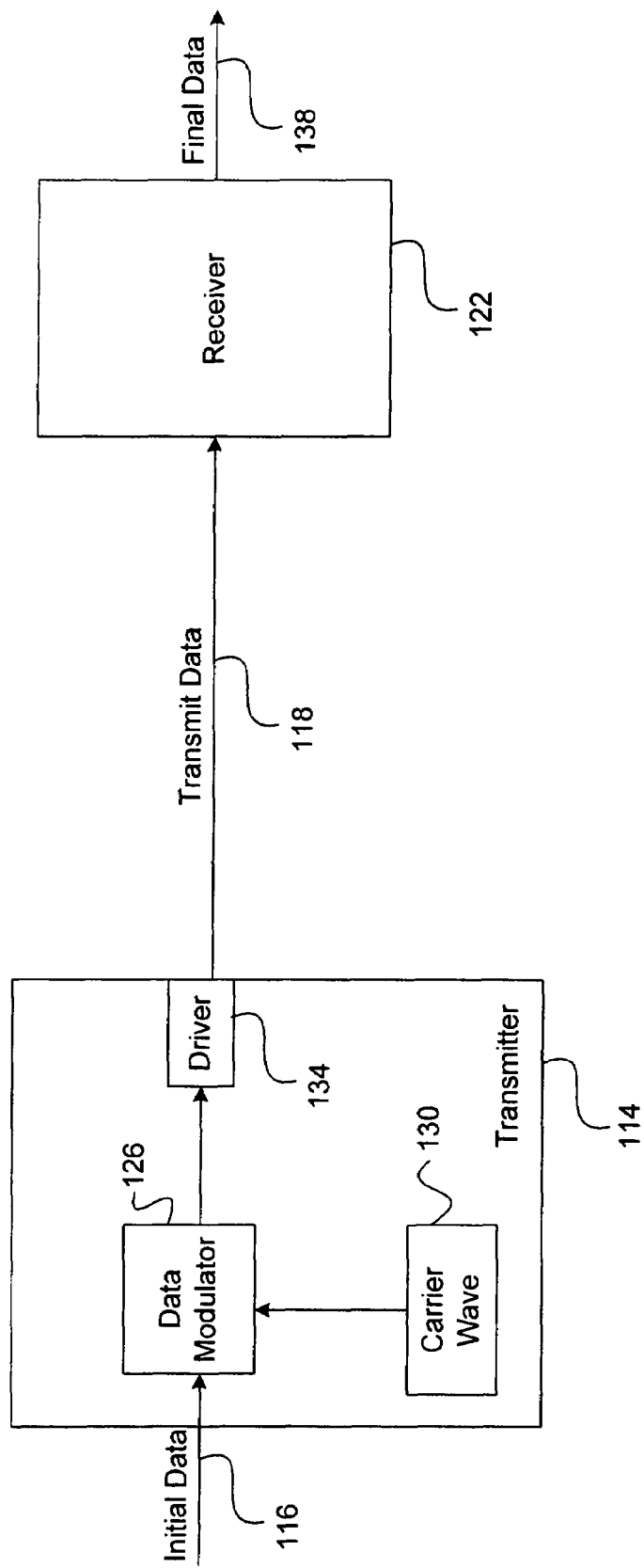
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data modulator 126 to receive initial data 116 from any appropriate data source. Data modulator 126 then modulates the initial data 116 using a carrier wave 130. A driver 134 outputs the modulated initial data 116 over any appropriate type of transmission channel as transmit data 118. A receiver 122 of data transmission system 110 may then receive and process the transmit data 118 to thereby provide final data 138 to any appropriate data destination. Further details regarding the implementation and utilization of receiver 122 are further discussed below in conjunction with FIGS. 2-8.

Figure 2:
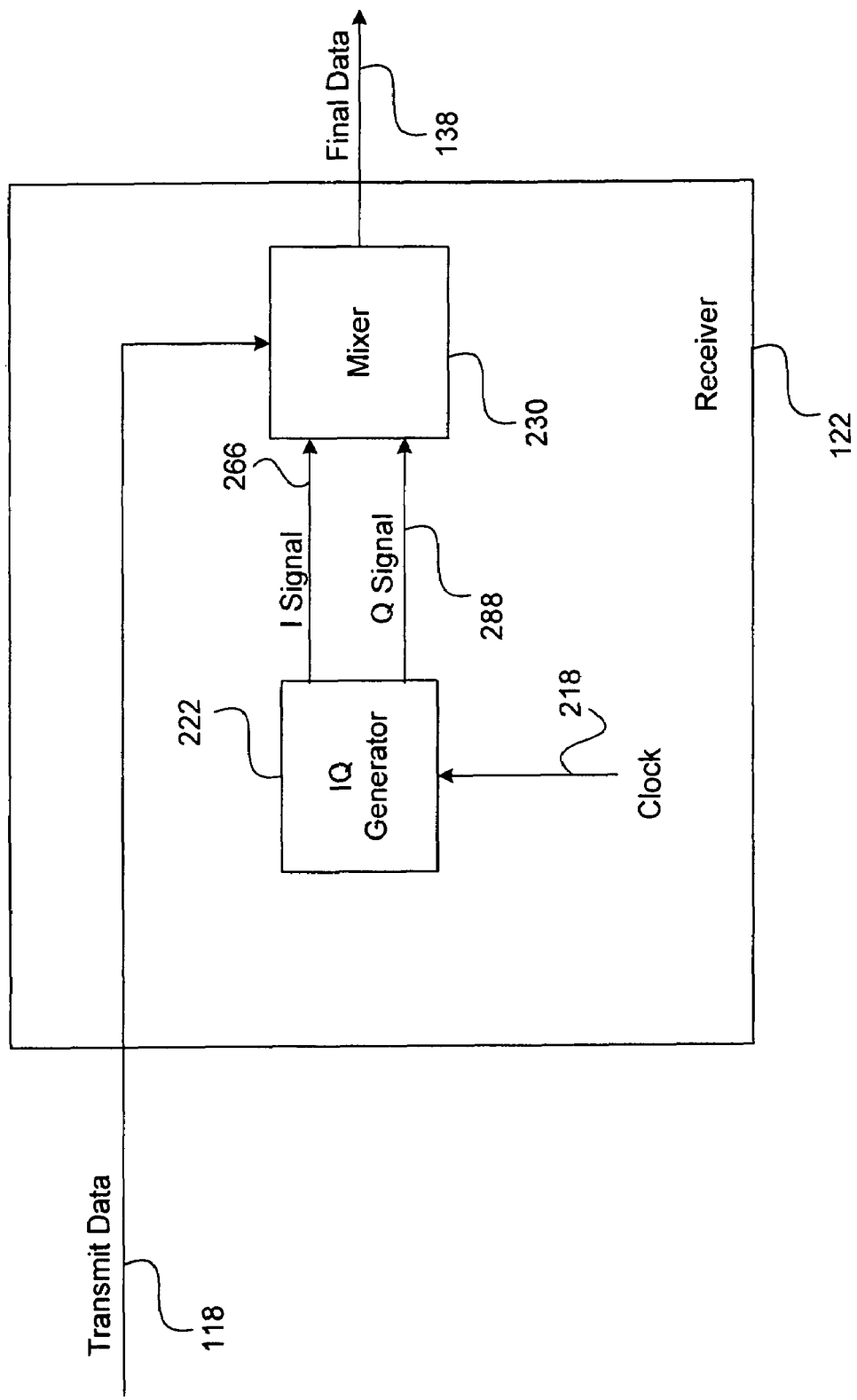
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an IQ generator 222 and a mixer 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device, such as a television tuner or a cellular telephone.

IQ generators are used extensively in many applications to generate quadrature signal that include in-phase (I) signals and quadrature (Q) signals, from a single clock source. For example, in a typical communications system using Single Side Band Modulation (SSB) two versions of the original signal are mixed with carrier waves that are also 90 degrees out-of-phase with respect to each other. By adding or subtracting the mixed products, an upper sideband or lower sideband modulated signal results. The accuracy of the 90-degree phase shift is important to the efficiency of the mixer 230 and to the minimization of unwanted extraneous images in the output signal.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, IQ generator 222 receives a clock signal 218 and responsively generates quadrature signals that include an I signal 266 and a Q signal 288 that are provided to mixer 230. These quadrature signals (I and Q) are preferably implemented with the same or similar waveform (typically derived from clock 218 at one-half the clock frequency). However, the quadrature signals are nominally ninety degrees out of phase with respect to each other.

Mixer 230 then utilizes the quadrature signals to demodulate transmit data 118 for producing final data 138. In certain embodiments, receiver 122 may be implemented as a single-sideband receiver that utilizes only one sideband (upper or lower) at a given time. Furthermore, any IQ phase mismatch in which the phase difference is not precisely ninety degrees typically results in unwanted generation of extraneous image signals from other ambient transmitted signals. Additional details for the implementation and utilization of IQ generators are further discussed below in conjunction with FIGS. 3-8.

Figure 3:
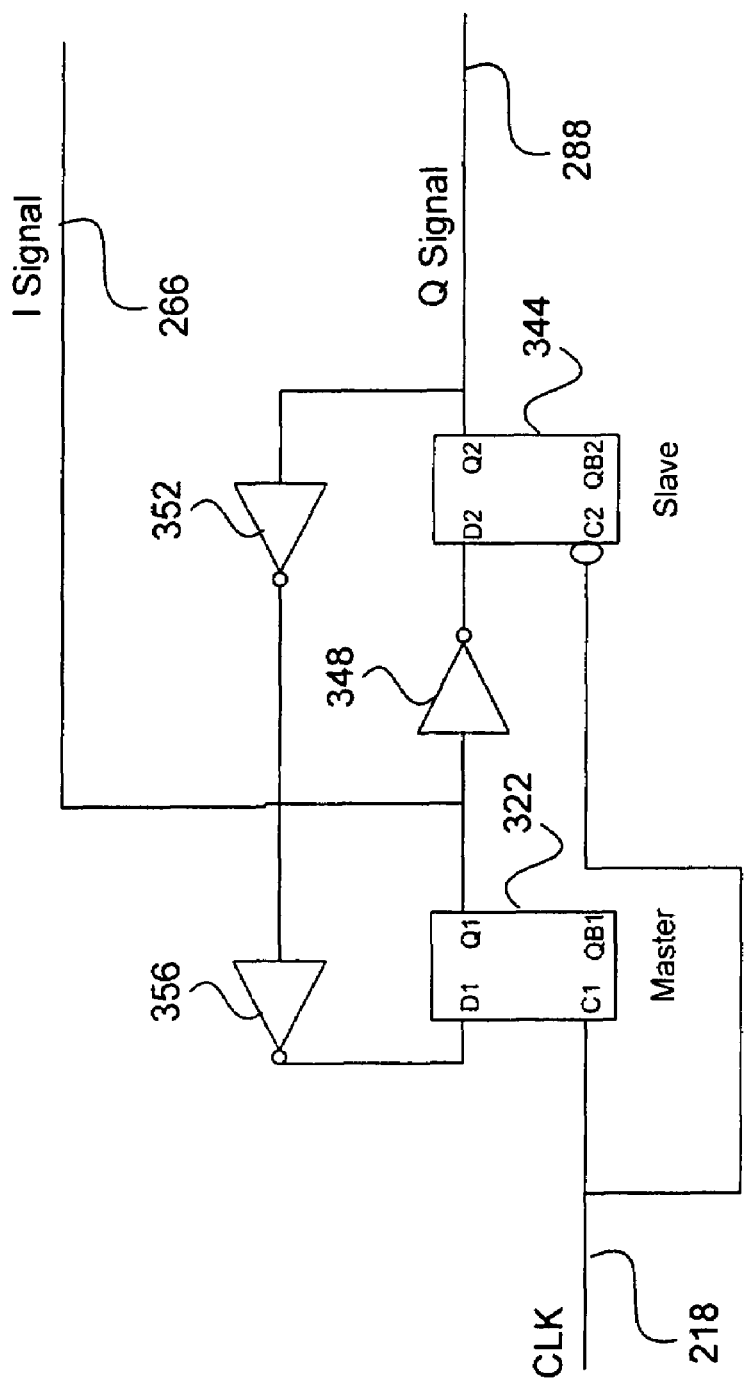
FIG. 3 is a schematic diagram for one embodiment of an IQ generator.

Referring now to FIG. 3, a schematic diagram for one embodiment of a basic IQ generator 310 is shown. The FIG. 3 diagram is presented for purposes of illustration, and in alternate embodiments, IQ generators may be implemented with components and functionalities in addition to, or instead of, certain of those components and functionalities discussed in conjunction with the FIG. 3 embodiment.

The FIG. 3 embodiment shows an IQ generator 310 comprising a clock source (CLK) 218 and a master slave flip flop (FF). In the FIG. 3 embodiment, master slave FF includes a master latch 322 and a slave latch 344 that may be implemented in any effective manner. For example, in certain embodiments, master latch 322 and slave latch 344 are each implemented as a level-triggered D-latch that operate in combination to create an edge-triggered master slave FF. The master and slave latches each have a latch input D, a clock input C, a non-inverted latch output Q, and an inverted latch output QB. Data on a latch input D is passed to a latch output Q on a positive level of latch clock input C, and is inverted at latch output QB.

In the FIG. 3 embodiment, master latch 322 and slave latch 344 are latched on the opposite phases of the clock 218 because of the inverter on the slave latch clock input C2. Normally, the slave output QB2 is fed back to the master input D1 to create a divide-by-2 function. In the FIG. 3 embodiment, inverter 348 has been added to master output Q1, and inverters 352 and 356 have been added to slave output Q2 in order to match master/slave Q and QB loading. The divide-by-2 function is still achieved by having an overall inversion from master output Q to master input D. Additional details for the implementation and utilization of IQ generator 310 are further discussed below in conjunction with FIG. 4.

Figure 4:
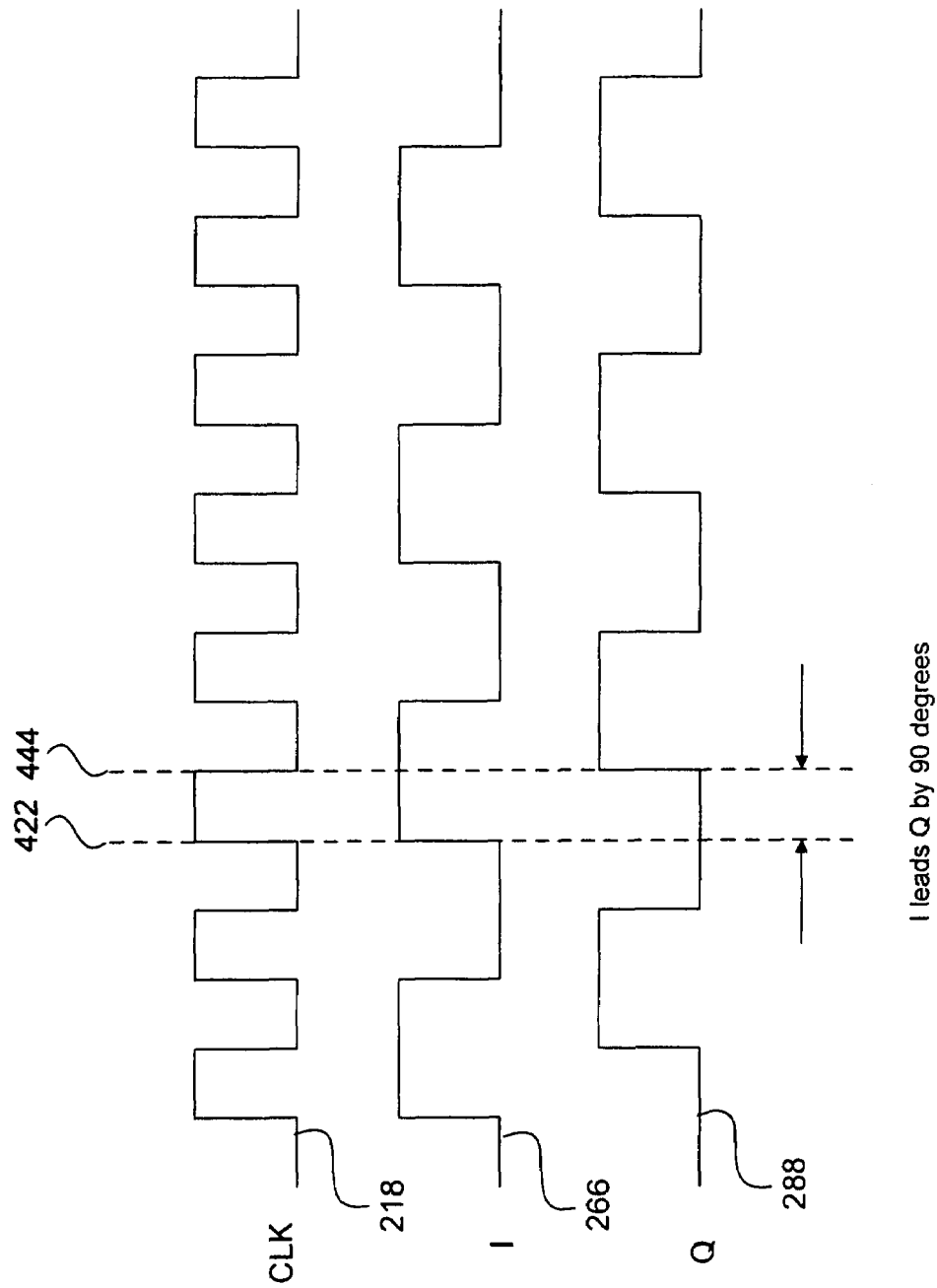
FIG. 4 is an exemplary timing diagram illustrating certain functions of the IQ generator of FIG. 3.

Referring now to FIG. 4, an exemplary timing diagram illustrating certain functions of the FIG. 3 IQ generator 310 is shown. The FIG. 4 diagram is presented for purposes of illustration. In alternate embodiments, IQ generators may readily utilize waveforms, timing relationships, and functionalities, in addition to, or instead of, certain of those waveforms, timing relationships, and functionalities discussed in conjunction with the FIG. 4 embodiment.

In the FIG. 4 embodiment, I signal 266 and Q signal 288 are running at one-half the frequency of clock signal (CLK) 218 and are separated by a 90-degree phase shift. It should be noted that the phase separation of I and Q for this type of IQ generator 310 is directly related to the input clock duty cycle and component mismatches between the master latch 322 and slave latch 344. For the purposes of describing this invention, the input clock 218 is assumed to have a fixed 50:50 duty cycle. IQ generator 310 of FIG. 3 typically produces IQ signals where I signal 266 leads Q signal 288 by 90 degrees.

Figure 5:
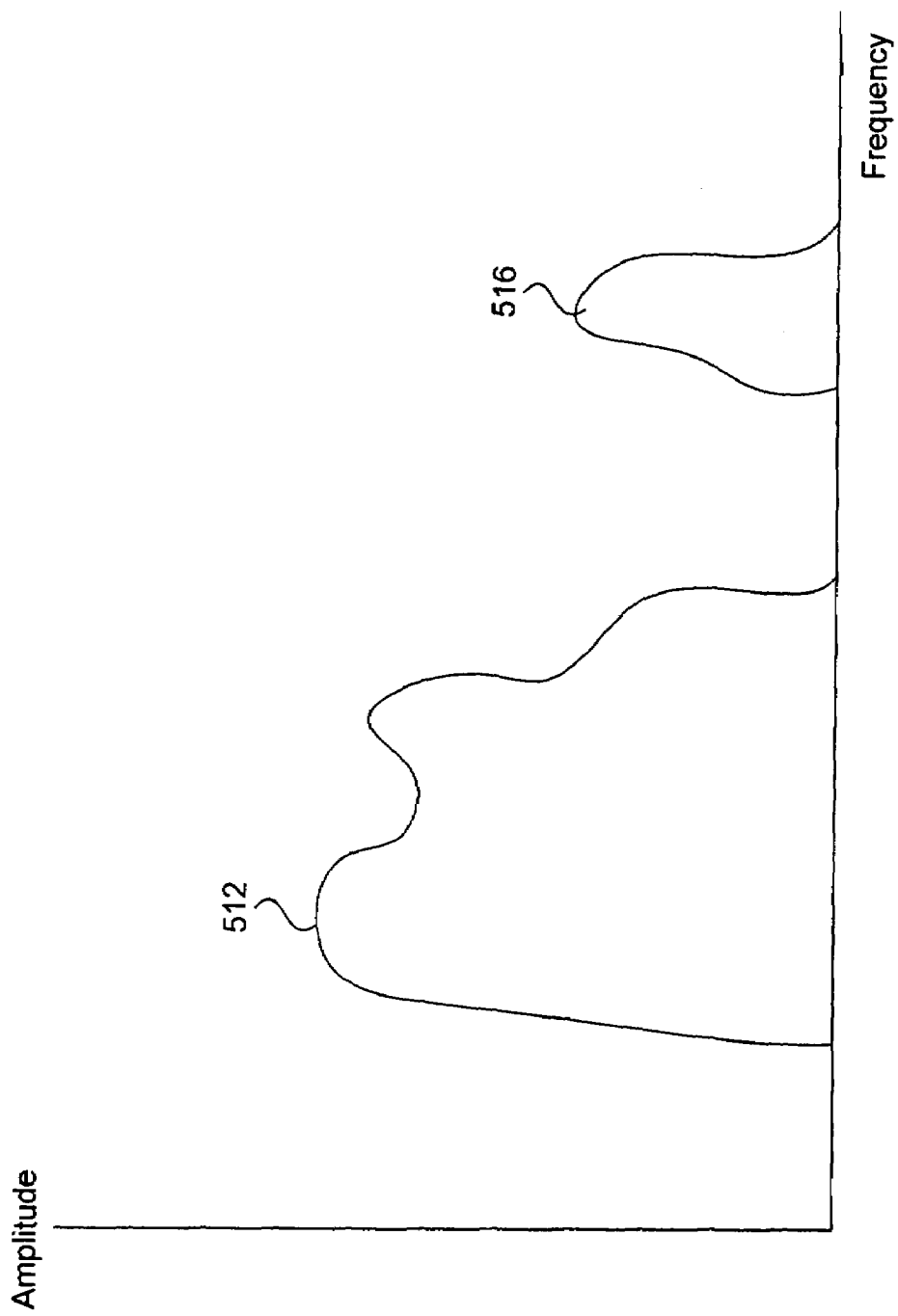
FIG. 5 is an graph illustrating potential IQ mismatch characteristics in the receiver of FIG. 2.

Referring now to FIG. 5, a graph illustrating exemplary IQ mismatch characteristics for the FIG. 2 receiver 122 is shown. The FIG. 5 diagram is presented for purposes of illustration, and in alternate embodiments, IQ mismatches may result in waveforms and characteristics in addition to, or instead of, certain of those waveforms and characteristics discussed in conjunction with the FIG. 5 embodiment.

The FIG. 5 graph shows frequency on a horizontal axis and amplitude on a vertical axis. The FIG. 5 graph depicts final data 138 (FIG. 2) provided by receiver 122. In the FIG. 5 example, final data 138 includes a desired signal 512 and an unwanted image signal 516. Image signal 516 may originate in spurious radio-frequency transmissions from signal sources other than the designated signal source that is intended for reception by receiver 122.

In a system that utilizes IQ demodulation, appropriate image rejection of image signal 516 may be achieved if the phase difference between I signal 266 and Q signal 288 is 90 degrees. When the phase difference becomes greater or less than 90 degrees, the image rejection begins to degrade. For high quality digital broadcast systems, good image rejection is required in the receiver. Most digital broadcast systems require more than 75 dB of image rejection. The formula below shows the relationship between image rejection (IMR) and relative I and Q phase error.

$$IMR = 10 \text{ Log}((1-\cos \delta\theta)/(1+\cos \delta\theta))$$

where $\delta\theta$ is the relative phase error between the I and Q signals, and IMR is the required image rejection. So to achieve −80 dB of image rejection, a relative phase error of 0.01 degrees is required between I signal 266 and Q signal 288. The relative size of image signal 516 is typically proportional to the amount of IQ mismatch. Effective techniques for implementing IQ mismatch compensation are further discussed below in conjunction with FIGS. 7-8.

Figure 6:
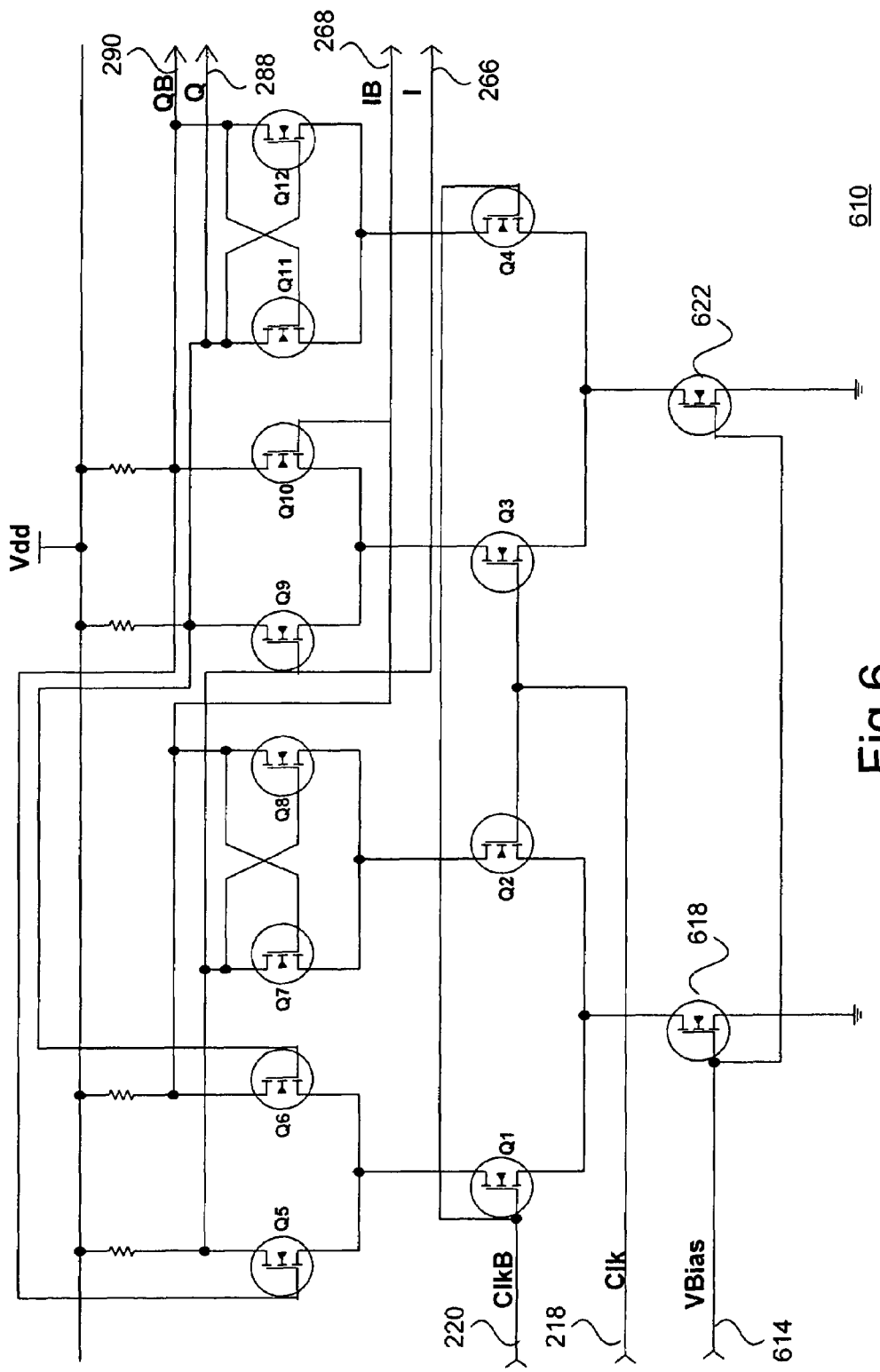
FIG. 6 is a schematic diagram for one embodiment of an IQ generator with a potential IQ mismatch.

Referring now to FIG. 6, a schematic diagram for one embodiment of an IQ generator 610 with a potential IQ mismatch is shown. The FIG. 6 diagram is presented for purposes of illustration, and in alternate embodiments, IQ generators may be implemented with components and functionalities in addition to, or instead of, certain of those components and functionalities discussed in conjunction with the FIG. 6 embodiment.

The FIG. 6 embodiment shows a divide-by-two circuit implemented in a CMOS process. In the FIG. 6 embodiment, transistors Q1, Q2, Q5, Q6, Q7 and Q8 form a master latch (D-type) and transistors Q3, Q4, Q9, Q10, Q11 and Q12 form a slave latch (D-type). Note that the output of the slave latch drives the master latch (180-degrees out-of-phase) to produce the divide-by-two function. The in-phase output (I) is taken from the master latch output, and the quadrature output (Q) is taken from the slave latch output.

Certain elements of the FIG. 6 embodiment have basic operational functionalities that are similar to comparable elements from the FIG. 3 embodiment (for example, master latch 322, slave latch 344, and certain of the input and output signals). In the FIG. 6 embodiment, IQ generator 610 may be implemented utilizing current mode logic (CML) techniques. In the FIG. 6 embodiment, IQ generator 610 utilizes complementary transistor pairs to receive complementary input signal pairs for generating an I signal 266, an inverted IB signal 268, a Q signal 288, and an inverted QB signal 290. The complementary input clock signal pairs (Clk 218 and ClkB 220) are implemented as a pair of inverted signals.

In the FIG. 6 embodiment, the master latch includes a master data transistor pair (transistors Q5 and Q6), a master latch transistor pair (transistors Q7 and Q8), and a master clock transistor pair (transistors Q1 and Q2). Similarly, the slave latch includes a slave data transistor pair (transistors Q9 and Q10), a slave latch transistor pair (transistors Q11 and Q12), and a slave clock transistor pair (transistors Q3 and Q4). In the FIG. 6 embodiment, a CML divide-by-2 function may thus be achieved by cascading the two differential latches (the master latch followed by the slave latch which is clocked from the opposite phase of the clock signal. In certain embodiments, the timing characteristics of IQ generator 610 may be similar to those timing characteristics portrayed above in the FIG. 4 timing diagram.

In the FIG. 6 embodiment, a current source A 618 generates operating current A that is provided to the sources of the master clock transistor pair (Q1 and Q2) to operate the components of the master latch. Similarly, a current source B 622 generates operating current B that is provided to the sources of the slave clock transistor pair (Q3 and Q4) to operate the components of the slave latch. In the FIG. 6 embodiment, component mismatches between the master latch and the slave latch may disadvantageously result in IQ mismatch between I signal 266 and Q signal 288.

For example, if current source A 618 and current source B 622 do not have identical electrical properties, then an IQ mismatch may result because operating current A would be different from operating current B. Furthermore, if the transistors in master clock transistor pair (Q1 and Q2) are not identically matched, then an IQ mismatch may result. Furthermore, if the transistors in slave clock transistor pair (Q3 and Q4) are not identically matched, then an IQ mismatch may result. Certain effective techniques for performing IQ mismatch compensation are discussed below in conjunction with FIGS. 7-8, in accordance with the present invention.

Figure 7:
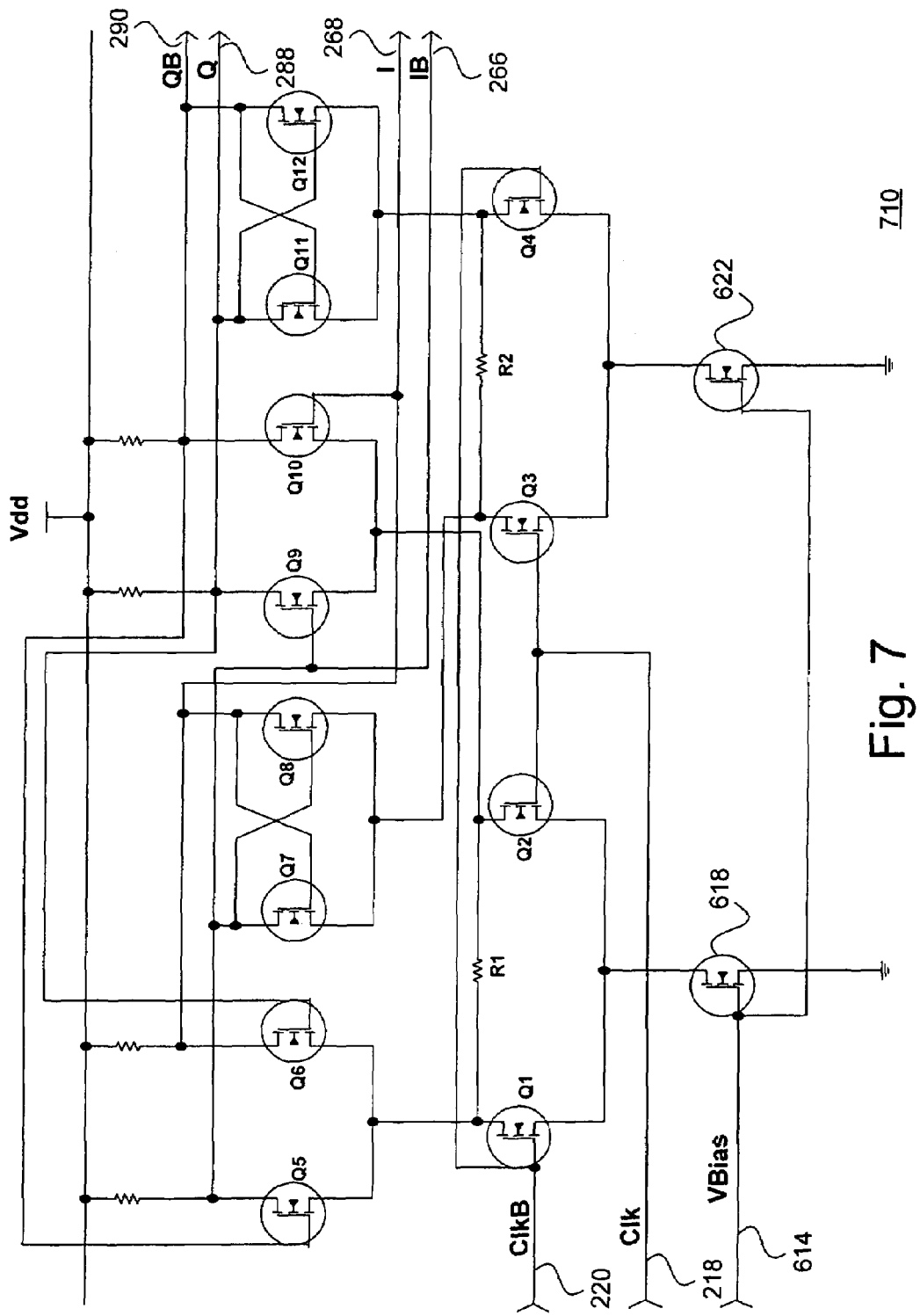
FIG. 7 is a schematic diagram for a first embodiment of an IQ generator with IQ mismatch compensation, in accordance with the present invention.

Referring now to FIG. 7, a schematic diagram for a first embodiment of an IQ generator 710 with IQ mismatch compensation is shown, in accordance with the present invention. The FIG. 7 diagram is presented for purposes of illustration, and in alternate embodiments, the present invention may be implemented with components and functionalities in addition to, or instead of, certain of those components and functionalities discussed in conjunction with the FIG. 7 embodiment.

The FIG. 7 embodiment shows a divide-by-two circuit implemented in a CMOS process. In the FIG. 7 embodiment, transistors Q1, Q2, Q5, Q6, Q7 and Q8 form a master latch (D-type) and transistors Q3, Q4, Q9, Q10, Q11 and Q12 form a slave latch (D-type). Note that the output of the slave latch drives the master latch (180-degrees out-of-phase) to produce the divide-by-two function. The in-phase output (I) is taken from the master latch output, and the quadrature output (Q) is taken from the slave latch output.

In the FIG. 7 embodiment, IQ generator 710 may be implemented utilizing current mode logic (CML) techniques. In the FIG. 7 embodiment, IQ generator 710 utilizes complementary transistor pairs to receive complementary input signal pairs for generating an I signal 266, an inverted IB signal 268, a Q signal 288, and an inverted QB signal 290. The complementary input clock signal pairs (Clk 218 and ClkB 220) are implemented as a pair of inverted signals.

In the FIG. 7 embodiment, the master latch includes a master data transistor pair (transistors Q5 and Q6), a master latch transistor pair (transistors Q7 and Q8), and a master clock transistor pair (transistors Q1 and Q2). Similarly, the slave latch includes a slave data transistor pair (transistors Q9 and Q10), a slave latch transistor pair (transistors Q11 and Q12), and a slave clock transistor pair (transistors Q3 and Q4). In the FIG. 7 embodiment, a CML divide-by-2 function may thus be achieved by cascading the two differential latches, the master latch followed by the slave latch which is clocked from the opposite phase of the clock signal. In certain embodiments, the timing characteristics of IQ generator 710 may be similar to those timing characteristics portrayed above in the FIG. 4 timing diagram.

In the FIG. 7 embodiment, a current source A 618 generates operating current A that is provided to the sources of the master clock transistor pair (Q1 and Q2). Similarly, a current source B 622 generates operating current B that is provided to the sources of the slave clock transistor pair (Q3 and Q4). In the FIG. 7 embodiment, an improved operating-current distribution technique is disclosed for effectively distributing operating current A and operating current B to enhance IQ mismatch compensation in IQ generator 710. In particular, the connections between the drains of the clock transistors pairs (Q1, Q2, Q3 and Q4) and the source connections of the data transistor pairs (Q5, Q6, Q9 and Q10) and latch transistor pairs (Q7, Q8, Q11 and Q12) should be noted.

Normally, the drain connections of a given clock transistor pair connect to the data transistor pair and the latch transistor pair from the same master/slave latch, as shown above in FIG. 6. However, in the FIG. 7 embodiment, the drain connections of a given clock transistor pair connect to the data transistor pairs from both the master latch and the slave latch. The drain connections from the other clock transistor pair connect to the latch transistor pairs from both the master latch and the slave latch. Since each of these cross-coupled latch transistor pairs (master and slave) share a common current source B 622, and since each of these cross-coupled data transistors pairs (master and slave) similarly share a common current source A 618, any device mismatch in the current source transistors 618 and 622 now has no effect on the IQ generator 710.

In the FIG. 7 embodiment, current source A 618 provides operating current A to the sources of transistor Q1 and transistor Q2 of the master clock transistor pair. The drain of transistor Q1 of the master clock transistor pair is connected to the sources of transistor Q5 and transistor Q6 of the master data transistor pair. The drain of transistor Q2 is connected to the sources of transistor Q9 and transistor Q10 of the slave data transistor pair. In this embodiment, a current source B 622 provides operating current B to the sources of transistor Q3 and transistor Q4 of the slave clock transistor pair. The drain of transistor Q3 of the slave clock transistor pair is connected to the sources of transistor Q7 and transistor Q8 of the master latch transistor pair. The drain of transistor Q4 is connected to the sources of transistor Q11 and transistor Q12 of the slave latch transistor pair.

In the FIG. 7 embodiment, the master clock transistor pair has a resistor R1 connected between the drains of the clock transistors Q1 and Q2. Similarly, the slave clock transistor pair has a resistor R2 connected between the drains of the clock transistors Q3 and Q4. Clock transistors Q1 and Q2 may have a dominant effect on the relative IQ phase error when their device mismatches are considered. Resistor R1 helps to specifically define the impedance at the source-drain connection between Q1, Q5 and Q6, as well as the source-drain connection between Q2, Q9 and Q10. Similarly, clock transistors Q3 and Q4 may have a dominant effect on the relative IQ phase error when their device mismatches are considered. Resistor R2 helps to specifically define the impedance at the source-drain connection between Q3, Q7 and Q8, as well as the source-drain connection between Q4, Q11 and Q12.

Looking at the node of the drain of Q1 and the source of Q5 and Q6, with no resistor R1, the node switches between defined impedance and high impedance as the gates of Q1 and Q2 are switched on and off. This contributes to the relative phase error out of the IQ generator 710. With a resistor R1 across the drains of Q1 and Q2, the resistor R1 and the current flowing through the resistor R1 specifically define the impedance at the drain and source connection.

Looking at the node of the drain of Q3 and the source of Q7 and Q8, with no resistor R2, the node switches between defined impedance and high impedance as the gates of Q3 and Q4 are switched on and off. This contributes to the relative phase error out of the IQ generator 710. With a resistor R2 across the drains of Q3 and Q4, the resistor R2 and the current flowing through the resistor R2 specifically define the impedance at the drain and source connection. For all of the foregoing reasons, the present invention provides an improved system and method for effectively implementing an IQ generator.

Figure 8:
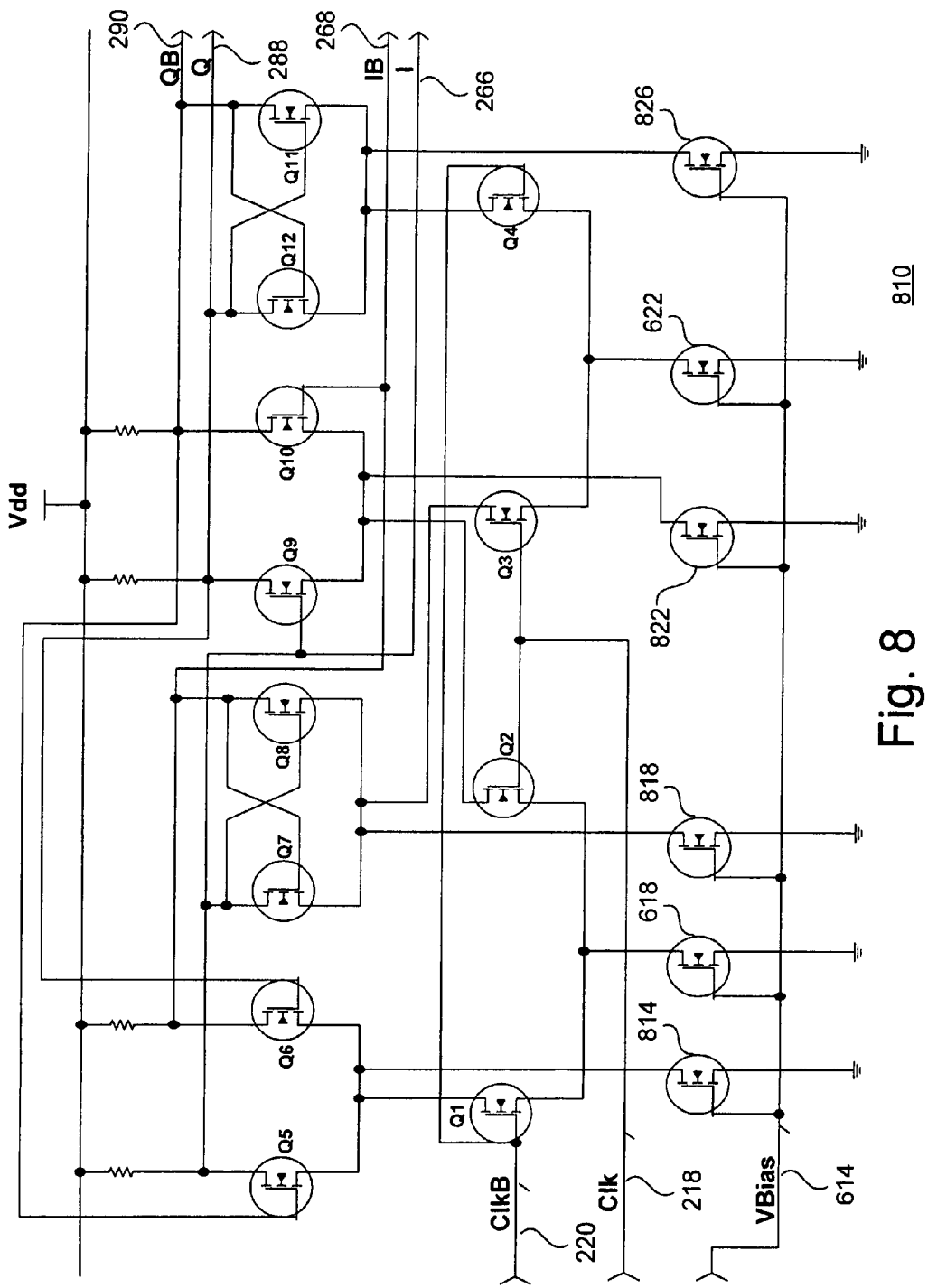
FIG. 8 is a schematic diagram for a second embodiment of an IQ generator with IQ mismatch compensation, in accordance with the present invention.

Referring now to FIG. 8, a schematic diagram for a second embodiment of an IQ generator 810 with IQ mismatch compensation is shown, in accordance with the present invention. The FIG. 8 diagram is presented for purposes of illustration, and in alternate embodiments, the present invention may be implemented with components and functionalities in addition to, or instead of, certain of those components and functionalities discussed in conjunction with the FIG. 8 embodiment.

The FIG. 8 embodiment is identical to the previously-discussed embodiment of FIG. 7, except that in the FIG. 8 embodiment, IQ generator 810 does not include resistor R1 or resistor R2 from the FIG. 7 embodiment. Instead, IQ generator 810 substitutes current sources 814, 818, 822, and 826 to perform the same or similar functions as those functions performed in the FIG. 7 IQ generator 710 by resistors R1 and R2. The prior disclosure and description of identically named, numbered, or configured elements from the FIG. 7 embodiment are hereby incorporated by reference with respect to the corresponding elements and configurations of IQ generator 810 from FIG. 8.

In the FIG. 8 embodiment, the drain impedance of the clock transistor pairs is fixed by current sources 814, 818, 822, and 826. The current source impedances fix the drain load of the clock transistor pairs to provide a defined impedance at the drain of the clock transistors. In the FIG. 8 embodiment, the drain of a current source 814 is connected to the drain of transistor Q1 from the master clock transistor pair, and the drain of a current source 818 is connected to the drain of transistor Q3 from the slave clock transistor pair. Similarly, the drain of a current source 822 is connected to the drain of transistor Q2 from the master clock transistor pair, and the drain of a current source 826 is connected to the drain of transistor Q4 from the slave clock transistor pair.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for implementing an IQ generator, comprising:
a master latch that generates an I signal, said master latch including a master data circuit, a master latch circuit, and a master clock circuit;
a slave latch that generates a Q signal, said slave latch including a slave data circuit, a slave latch circuit, and a slave clock circuit;
a current source A that generates an operating current A for said master clock circuit, said master data circuit, and said slave data circuit, said master clock circuit including a first fixed impedance to compensate for a master-clock component mismatch; and
a current source B that generates an operating current B for said slave clock circuit, said master latch, and said slave latch, said slave clock circuit including a second fixed impedance to compensate for a slave-clock component mismatch.

2. The system of claim 1 wherein said IQ generator is implemented with a cross-coupled current source configuration that compensates for component mismatches between said current source A and said current source B to prevent IQ mismatches between said I signal and said Q signal.

3. The system of claim 1 wherein said IQ generator is configured as a divide-by-two device that generates said I signal and said Q signal at an output frequency that is one half of an input frequency of a clock input signal, said IQ generator outputting said I signal and said Q signal with a ninety-degree phase separation.

4. The system of claim 1 wherein said IQ generator provides said I signal and said Q signal as quadrature signals to a radio-frequency receiver that includes a mixer device that utilizes said I signal and said Q signal to demodulate a transmitted input signal.

5. The system of claim 1 wherein said IQ generator is implemented with differential logic circuitry that utilizes complementary transistor pairs to receive complementary input signals.

6. The system of claim 5 wherein said complementary transistor pairs of said master latch include a master data pair in said master data circuit, a master latch pair in said master latch circuit, and a master clock pair in said master clock circuit.

7. The system of claim 6 wherein said complementary transistor pairs of said slave latch include a slave data pair in said slave data circuit, a slave latch pair in said slave latch circuit, and a slave clock pair in said slave clock circuit.

8. The system of claim 7 wherein said complementary input signals include complementary clock signals.

9. The system of claim 7 wherein said IQ generator utilizes a VBIAS input signal to control said current source A and said current source B.

10. The system of claim 7 wherein said master latch outputs said I signal and an inverted I signal, said slave latch outputting said Q signal and an inverted Q signal, said Q signal and said inverted Q signal being returned as data input signals via a feedback loop to said master latch.

11. The system of claim 7 wherein said master data pair includes a transistor Q5 and a transistor Q6, said master latch pair including a transistor Q7 and a transistor Q8, said master clock pair including a transistor Q1 and a transistor Q2.

12. The system of claim 11 wherein said slave data pair includes a transistor Q9 and a transistor Q10, said slave latch pair including a transistor Q11 and a transistor Q12, said slave clock pair including a transistor Q3 and a transistor Q4.

13. The system of claim 12 wherein a drain of said current source A is connected to sources of said transistor Q1 and said transistor Q2.

14. The system of claim 13 wherein a drain of said transistor Q1 is connected to sources of said transistor Q5 and said transistor Q6, a drain of said transistor Q2 being connected to sources of said transistor Q9 and said transistor Q10.

15. The system of claim 12 wherein a drain of said current source B is connected to sources of said transistor Q3 and said transistor Q4.

16. The system of claim 15 wherein a drain of said transistor Q3 is connected to sources of said transistor Q7 and said transistor Q9, a drain of said transistor Q4 being connected to sources of said transistor Q11 and said transistor Q12.

17. The system of claim 1 wherein an unwanted image signal is removed from an output signal of a radio-frequency receiver device when IQ mismatches between said I signal and said Q signal are eliminated.

18. A method for implementing an IQ generator, comprising:
generating an I signal with a master latch that includes a master data circuit, a master latch circuit, and a master clock circuit;
generating a Q signal with a slave latch that includes a slave data circuit, a slave latch circuit, and a slave clock circuit;
utilizing a current source A to generate an operating current A for said master clock circuit, said master data circuit, and said slave data circuit, said master clock circuit including a first fixed impedance to compensate for a master-clock component mismatch; and
utilizing a current source B to generate an operating current B for said slave clock circuit, said master latch, and said slave latch, said slave clock circuit including a second fixed impedance to compensate for a slave-clock component mismatch.

19. A system for implementing an IQ generator, comprising:
a master latch that generates an I signal, said master latch including a master data circuit, a master latch circuit, and a master clock circuit;
a slave latch that generates a Q signal, said slave latch including a slave data circuit, a slave latch circuit, and a slave clock circuit;
a current source A that generates an operating current A for said master clock circuit, said master data circuit, and said slave data circuit; and
a current source B that generates an operating current B for said slave clock circuit, said master latch, and said slave latch, said IQ generator being implemented with differential logic circuitry that utilizes complementary transistor pairs to receive complementary input signals, said complementary transistor pairs of said master latch include a master data pair in said master data circuit, a master latch pair in said master latch circuit, and a master clock pair in said master clock circuit, said complementary transistor pairs of said slave latch include a slave data pair in said slave data circuit, a slave latch pair in said slave latch circuit, and a slave clock pair in said slave clock circuit, said master data pair includes a transistor Q5 and a transistor Q6, said master latch pair including a transistor Q7 and a transistor Q8, said master clock pair including a transistor Q1 and a transistor Q2, said slave data pair includes a transistor Q9 and a transistor Q10, said slave latch pair including a transistor Q11 and a transistor Q12, said slave clock pair including a transistor Q3 and a transistor Q4, a resistor R1 being connected between drains of said transistor Q1 and said transistor Q2, a resistor R2 similarly being connected between drains of said transistor Q3 and said transistor Q4.

20. A system for implementing an IQ generator, comprising:
- a master latch that generates an I signal, said master latch including a master data circuit, a master latch circuit, and a master clock circuit;
- a slave latch that generates a Q signal, said slave latch including a slave data circuit, a slave latch circuit, and a slave clock circuit;
- a current source A that generates an operating current A for said master clock circuit, said master data circuit, and said slave data circuit; and
- a current source B that generates an operating current B for said slave clock circuit, said master latch, and said slave latch, said IQ generator being implemented with differential logic circuitry that utilizes complementary transistor pairs to receive complementary input signals, said complementary transistor pairs of said master latch include a master data pair in said master data circuit, a master latch pair in said master latch circuit, and a master clock pair in said master clock circuit, said complementary transistor pairs of said slave latch include a slave data pair in said slave data circuit, a slave latch pair in said slave latch circuit, and a slave clock pair in said slave clock circuit, said master data pair includes a transistor Q5 and a transistor Q6, said master latch pair including a transistor Q7 and a transistor Q8, said master clock pair including a transistor Q1 and a transistor Q2, said slave data pair includes a transistor Q9 and a transistor Q10, said slave latch pair including a transistor Q11 and a transistor Q12, said slave clock pair including a transistor Q3 and a transistor Q4, a resistor R1 provides a first fixed impedance at said drains of said transistor Q1 and said transistor Q2 to compensate for device mismatches between said transistor Q1 and said transistor Q2, a resistor R2 similarly providing a second fixed impedance at said drains of said transistor Q3 and said transistor Q4 to compensate for said device mismatches between said transistor Q3 and said transistor Q4, said resistor R1 and said resistor R2 thus preventing IQ mismatches between said I signal and said Q signal.

* * * * *